(12) United States Patent
Kusunoki et al.

(10) Patent No.: US 7,259,621 B2
(45) Date of Patent: Aug. 21, 2007

(54) DISTORTION COMPENSATING DEVICE AND POWER AMPLIFYING DEVICE WITH DISTORTION COMPENSATING FUNCTION

(75) Inventors: Shigeo Kusunoki, Kanagawa (JP); Katsuji Kawakami, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 70 days.

(21) Appl. No.: 11/045,262

(22) Filed: Jan. 31, 2005

(65) Prior Publication Data
US 2005/0212595 A1   Sep. 29, 2005

(30) Foreign Application Priority Data
Feb. 9, 2004   (JP) .............................. 2004-032351

(51) Int. Cl.
*H03F 1/26* (2006.01)
(52) U.S. Cl. ..................................... 330/149; 455/114.3
(58) Field of Classification Search ............... 330/149; 455/114.3
See application file for complete search history.

(56) References Cited

U.S. PATENT DOCUMENTS 6,353,360 B1 * 3/2002 Hau et al. ................... 330/149

* cited by examiner

*Primary Examiner*—Robert Pascal
*Assistant Examiner*—Hieu Nguyen
(74) *Attorney, Agent, or Firm*—Oblon, Spivak, McClelland, Maier & Neustadt, P.C.

(57) ABSTRACT

One divided signal divided into two by a dividing circuit is inputted to a gate of a source grounded FET through a first matching circuit. In a drain of the FET, a second harmonic having a phase and an amplitude in accordance with an impedance of the first matching circuit is generated and extracted in a band pass filter and then the amplitude is adjusted in an attenuation circuit to input to an addition circuit through a second matching circuit. In the addition circuit, the output of the second matching circuit is added to another divided signal of the dividing circuit and inputted to a power amplifier. The impedance in the first matching circuit affecting the phase of the second harmonic generated from the FET is set so that a distortion component generated in the power amplifier is compensated for by the second harmonic inputted in the addition circuit.

6 Claims, 4 Drawing Sheets

CONVENTIONAL ART

F I G. 3
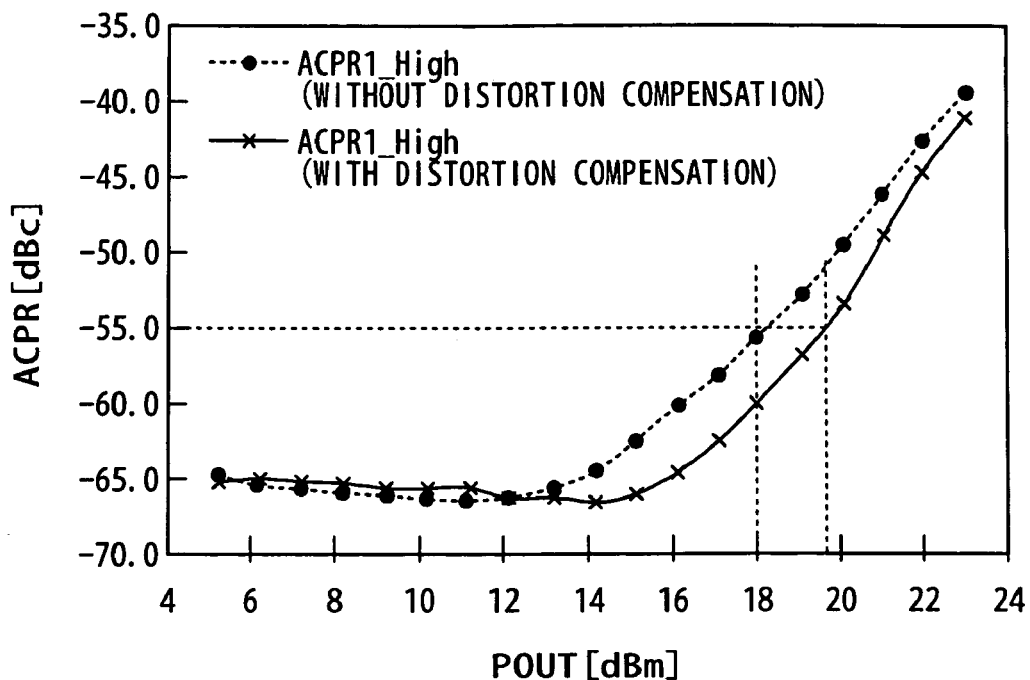
F I G. 4
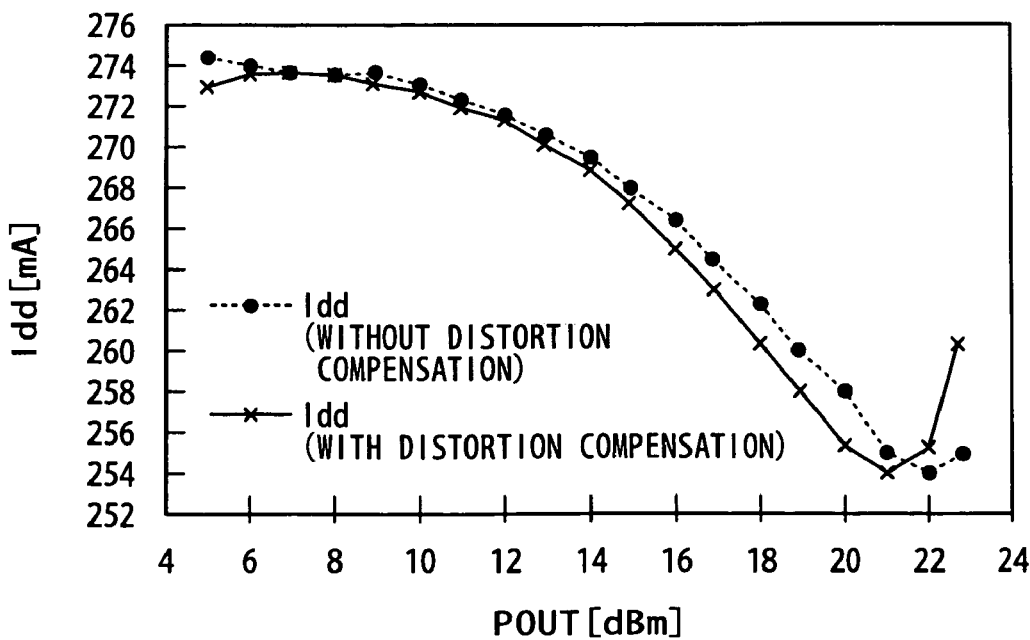

DISTORTION COMPENSATING DEVICE AND POWER AMPLIFYING DEVICE WITH DISTORTION COMPENSATING FUNCTION

CROSS REFERENCE TO RELATED APPLICATIONS

The present document is based on Japanese Priority Document JP2004-032351, filed in the Japanese Patent Office on Feb. 9, 2004, the entire contents of which being incorporated herein by reference.

BACKGROUND OF THE INVENTION

1. Field of the Invention

The present invention relates to a distortion compensating device and more particularly to a distortion compensating device applicable to a high frequency power amplifier and a power amplifying device with a distortion compensating function.

2. Description of the Related Art

Generally speaking, in a mobile telephone employing a CDMA (Code Division Multiple Access) system, the transmission power of a terminal is constantly fluctuating and the peak of output distribution is in the vicinity of about 10 mW in the case where voice is used. Therefore, in many of the CDMA mobile telephone terminals, the power-supply voltage of a power amplifier (PA) is changed between low output and high output by using a DC-DC converter to increase efficiency in the low output. However, as the mobile telephone terminal becomes to include more data processing functions, it is considered that the transmission power distribution is shifting to the higher output side.

Consequently, the output of as high a power as possible particularly in a state of a low power-supply voltage leads to low power consumption in the entire terminal. More specifically, it is important to make higher a switching power threshold at which switching between the low output and the high output is performed. However, when the switching power threshold is made higher, distortion is increased, so that reducing the distortion in the low output is an important issue. Although distortion compensation techniques have been proposed since some years ago, they cannot be immediately applied to the mobile telephone terminal in view of an increase in circuit scale or the like.

In recent years, there has been proposed a technique in which the distortion is improved by injecting a second harmonic (Non-patent Documents 1 to 4).

FIG. 2 shows a typical device configuration closest to the present invention. In FIG. 2, an input signal is divided into two in a dividing circuit (div) 21 and one of the divided signals is inputted to a gate of a small-size gate grounded FET (Field Effect Transistor) 22. A second harmonic generated in the FET 22 is extracted in a band pass filter (BPF) 23. Thereafter, for the extracted second harmonic, a phase and amplitude thereof are adjusted by a phase shift circuit (Ph) 24 and an attenuation circuit (ATT) 25 respectively to input them in a first input terminal of an addition circuit (add) 26. On the other hand, the other output of the dividing circuit 21 is inputted to a second input terminal of this addition circuit 26 and this addition output is inputted to an input terminal of a power amplifier (A) 27. Distortion generated by the power amplifier 27 is reduced by optimally adjusting the phase and the amplitude of the second harmonic generated in the FET 22 by the phase shift circuit 24 and the attenuation circuit 25, respectively.

[Non-Patent Document 1]
K. Joshin, Y. Nakasha, T. Iwai, T. Miyashita, S. Ohara, "Harmonic Feedback Circuit Effects on Intermodulation Products and Adjacent Channel Leakage Power in HBT Power Amplifier for 1.9 GHz Wide-Band CDMA Cellular Phones," IEICE Trans. Electron., vol. E82-C, No. 5, May, 1999, pp. 725-729.

[Non-Patent Document 2]
M. R. Moazzam, C. S. Aitchison, "A Low Order Intermodulation Amplifier with Harmonic Feedback Circuitry, "IEEEMTT-S Digest, 1996, WE3F-5.

[Non-Patent Document 3]
D. Jing, W. Chan S. M. Li, C. S. Li, "New Linearization Method Using Interstage Second Harmonic Enhancement," IEEE Microwave and Guide Wave Letters, vol. 8, No. 11, pp. 402-404, Nov. 1998.

[Non-Patent Document 4]
N. Males-Ilic, B. Milovanovic, D. Budimir, "Low Intermodulation Amplifiers for RF and Microwave Wireless System, "Asian Pacific Microwave Conference 2001, Proceedings pp. 984-987.

[Non-Patent Document 5]
S. Kusunoki, T. Furuta and Y. Murakami, "An analysis of higher-order IMD depending on source impedance of a GaAs FET and its application to a design of low distortion MMIC power amplifiers, "Electronics and Communications in Japan, vol. 85, No. 4, pp. 10-21, Apr. 2002, John Wiley and Sons, Inc. NY. USA. ("An analysis of higher-order intermodulation distortion depending on gate connected impedance and improvement in digital modulation distortion of power amplifiers," Japanese Journal of The Institute of Electronics, Information and Communication Engineers, vol. J83-C, No. 6, pp. 542-552, June 2000.)

An amount of the phase to be rotated by the phase shift circuit 24 included in the configuration of FIG. 2 is determined according to a nonlinear characteristic of the power amplifier 27 subjected to the distortion compensation. The phase shift circuit 24 is composed of a delay line such as a strip line. Since the circuit scale depends on a frequency and the frequency of CDMA commercialized at present in Japan is a 900 MHz band, there is a drawback that the scale becomes relatively large.

SUMMARY OF THE INVENTION

Accordingly, it is desirable to provide a distortion compensating device capable of compensating for distortion of a power amplifier without using a phase shift circuit which increases the circuit scale, and a power amplifying device with a distortion compensating function.

A distortion compensating device of the present invention is arranged in a previous stage of a power amplifier and compensates for distortion generated in the power amplifier. This device includes a dividing circuit in which an input signal is divided into two and outputted to first and second output terminals, a matching circuit in which the signal from the first output terminal of the dividing circuit is inputted an impedance is matched, a transistor in which a source (or an emitter) thereof is grounded and the signal from the matching circuit is inputted to a gate (or a base) thereof, a band pass filter in which the signal from a drain (or a collector) of the transistor is inputted and only a second harmonic of the input signal is passed, and an addition circuit in which the signal outputted from the band pass filter is added to a signal outputted from the second output terminal of the dividing circuit and this added signal is inputted to the power amplifier, wherein the impedance in the matching circuit affecting a phase of the second harmonic generated from the transistor is matched so that a distortion component generated in the power amplifier is compensated for by the second harmonic inputted in the addition circuit.

The transistor generates the second harmonic based on the one signal obtained by dividing the input signal into two in the dividing circuit. The band pass filter extracts this second harmonic. In the addition circuit, the extracted second harmonic component is added to the other signal obtained by dividing the input signal into two in the dividing circuit. Since the phase and the amplitude of the second harmonic component generated in the transistor depend on a predetermined impedance of the matching circuit, by appropriately setting this impedance, the phase of the second harmonic can be adjusted without using a phase shift circuit. By adding this second harmonic to the input signal in the addition circuit, the distortion component generated in the power amplifier can be compensated for.

The use of the attenuation circuit attenuating the output of the band pass filter at a predetermined attenuation ratio allows the amplitude of the second harmonic to be adjusted more appropriately.

Furthermore, the arrangement of a second matching circuit between the attenuation circuit and the addition circuit prevents the second harmonic from being reflected at an input end of the power amplifier, so that more favorable injection of the second harmonic can be accomplished.

The power amplifier is used for a CDMA system mobile telephone terminal, for example.

Furthermore, a power amplifying device with a distortion compensating function according to the present invention includes a matching circuit in which an input signal is inputted and an impedance is matched, a first transistor in which the signal from this matching circuit is inputted to a gate (or abase) thereof and a source (or an emitter) thereof is grounded, a dividing circuit in which the signal from a drain (or a collector) of the first transistor is inputted and this signal is divided into two to output to first and second output terminals, a band pass filter in which the signal from the first output terminal of the dividing circuit is inputted and only a second harmonic of this signal is passed, an addition circuit in which the signal outputted from the band pass filter is added to a signal outputted from the second output terminal of the dividing circuit, and a second transistor in which the signal from this addition circuit is inputted to a gate (or a base) thereof, a source (or an emitter) thereof is grounded, and an output signal is generated from a drain (or a collector) thereof, wherein the impedance in the matching circuit affecting a phase of the second harmonic generated from the first transistor is matched so that a distortion component generated in the second transistor is compensated for by the second harmonic inputted in the addition circuit.

In this power amplifying device with a distortion compensating function, the distortion compensating function is included inside a power amplifier and the action of the distortion compensation is similar to that of the above-mentioned distortion compensating device.

The distortion compensating device and the power amplifying device with a distortion compensating function in the present invention do not adjust the phase of the second harmonic for distortion compensation, which is injected to the power amplifier, by the phase shift circuit as in the conventional manner, but adjust the impedance of the matching circuit connected in the previous stage of the transistor to optimize the phase of the second harmonic, so that a large-size phase shift circuit as is found in the conventional art is not required. Accordingly, the miniaturization of the device can be accomplished and thus the application to a mobile telephone terminal becomes easier.

BRIEF DESCRIPTION OF THE DRAWINGS

FIG. 3 is a graph showing an actual measurement result of performance of the distortion compensating device in FIG. 1;

FIG. 4 is a graph showing comparison in circuit power consumption between a case with distortion compensation and a case without distortion compensation;

DETAILED DESCRIPTION OF THE EMBODIMENTS

Hereinafter, the preferred embodiments of the present invention are described in detail.

Figure 1:
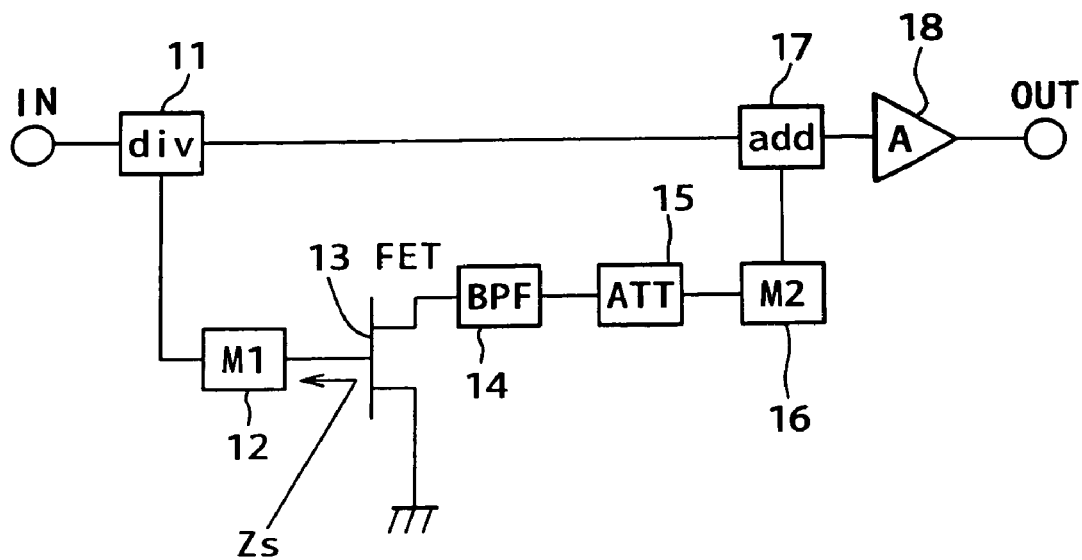
FIG. 1 is a circuit block diagram of a first embodiment of the present invention.

FIG. 1 is a circuit block diagram of a first embodiment of the present invention. A configuration is first described. This circuit composes a distortion compensating device for compensating distortion generated by a power amplifier (A) 18. The distortion compensating device includes: a dividing circuit (div) 11 which divides an input signal inputted in an input terminal IN into two; a source grounded FET 13; a first matching circuit (M1) 12 connected between a first output terminal of the dividing circuit 11 and a gate terminal of the FET 13; a band pass filter (BPF) 14 which is connected to a drain terminal of the FET 13 to pass only a second harmonic; an attenuation circuit (ATT) 15 which is connected to the output of this band pass filter 14 to attenuate a signal voltage of the second harmonic; a second matching circuit (M2) 16 connected to output of the attenuation circuit 15; and an addition circuit (add) 17 in which the output of the second matching circuit 16 is connected to a first input terminal thereof, the second output of the dividing circuit 11 is connected to a second input terminal thereof, and the signals inputted to both the first and second input terminals are added to each other to output from an output terminal thereof. The output of the addition circuit 17 is connected to an input terminal of the power amplifier (A) 18. In the present embodiment, as the FET 13, a small-size FET with a gate width of about 200 μm is used.

Next, the operation of the circuit in FIG. 1 is described. The input signal inputted to the input terminal IN is divided into two in the dividing circuit 11, one of the divided signals is inputted to the gate grounded FET 13 through the first matching circuit 12. The second harmonic generated in FET 13 is extracted in the band pass filter 14, its amplitude is adjusted by the attenuation circuit 15, and the resultant is inputted to the first input terminal of the addition circuit 17 through the second matching circuit 16. The second matching circuit 16 realizes matching so that the second harmonic outputted from the attenuation circuit 15 is efficiently inputted to the power amplifier 18 through the addition circuit 17 without reflection. On the other hand, the other output of the dividing circuit 11 is inputted to the second input terminal of the addition circuit 17 and the addition output is inputted to the power amplifier 18.

Next, mechanisms which compensate for the distortion of the power amplifier 18 are described. A distortion component generated in the FET 13 depends on the impedance Zs connected to the gate of the FET 13 as described in Non-patent Document 5. More specifically, the impedance Zs connected to the gate affects a phase and an amplitude of the distortion component generated in the FET 13. Since the second harmonic is also a distortion component, the characteristics described in Non-patent Document 5 hold true of the second harmonic. Accordingly, by adjusting the impedance Zs, the phase of the generated second harmonic can be set to a value required for the distortion compensation of the power amplifier 18. In particular, with respect to the phase, rotation of the phase equivalent to rotation by the conventional phase shift circuit 24 (FIG. 2) is brought about to the second harmonic generated in the FET 13 by adjusting the value of the first matching circuit 12. This can make the phase shift circuit 24 dispensable. Since the matching circuit 12 can be generally realized with ease in a concentrated constant circuit, the circuit scale can be dramatically miniaturized as compared with the phase shift circuit 24.

Figure 2:
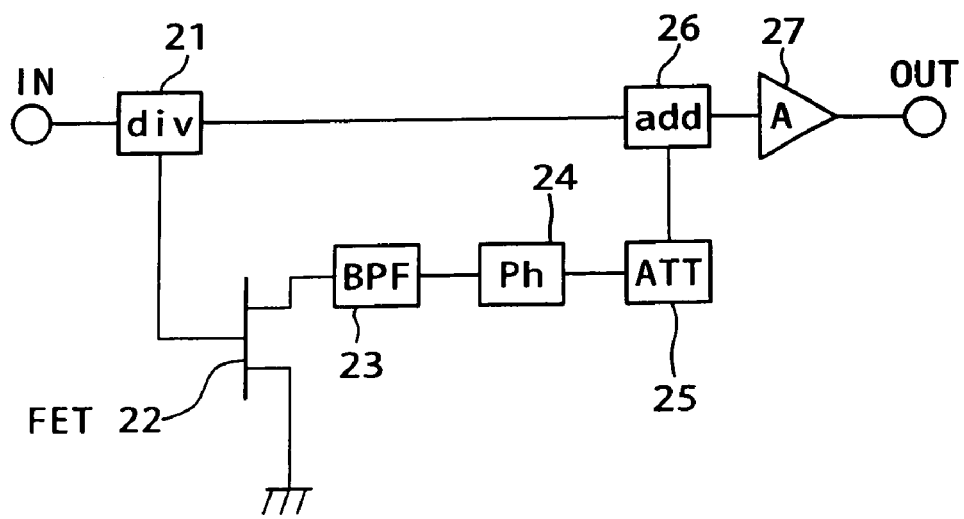
FIG. 2 is a circuit block diagram showing a conventional typical configuration closest to the present invention.

In the conventional circuit in FIG. 2, although the matching circuit can be inserted between the dividing circuit 21 and the gate of the FET 22, it is intended to prevent the reflection of a signal between the dividing circuit 21 and the FET 22, not intended to adjust the phase of the second harmonic as in the present invention.

Figure 6A:
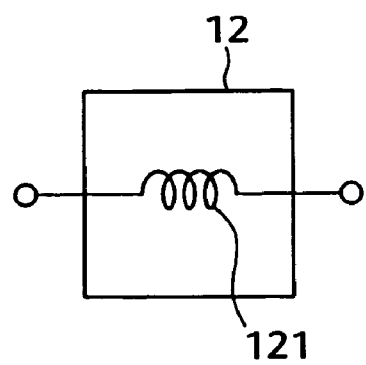
FIG. 6 is a circuit diagram showing concrete configuration examples of first and second matching circuits used in the actual measurement in the embodiment of the present invention.
Figure 6B:
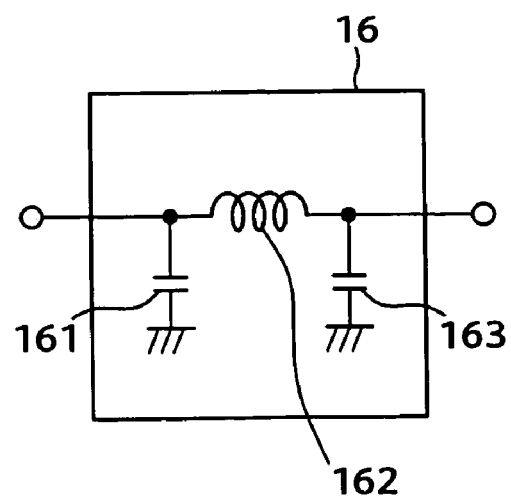

FIG. 3 shows an actual measurement result of performance of the distortion compensating device in FIG. 1. A signal frequency is 900 MHz and a signal is of CDMA uplink with an Offset-QPSK modulated wave used and a diffusion rate set to 1.2288 Mcps. FIGS. 6A and 6B show concrete configuration examples of the first and second matching circuits 12 and 16 used in this actual measurement. In the present embodiment, the first matching circuit 12 can be composed of an inductor 121. The second matching circuit 16 can be composed of a type II circuit including capacitors 161 and 163 and an inductor 162. However, the configurations of the first and second matching circuits 12 and 16 in the present invention are not limited to ones shown in the figures. A graph of FIG. 3 indicates an adjacent channel leakage power ratio (ACPR) (in the vertical axis) with respect to an output power (in the horizontal axis), in which the effect is compared between a case where the distortion compensation of the present invention is performed and a case where it is not performed. That is, a curve plotted with circle dots indicates a case without the distortion compensation and a curve plotted with x dots indicates a case with the distortion compensation.

The operating performance of a power amplifier used in a normal CDMA terminal at the time of lower voltage is assumed to have a maximum output of 18 dBm, and a power-supply voltage of 1.5 V, and the ACPR of about −55 dBc at that time. The characteristics of the power amplifier in the case where the distortion compensation by the circuit in FIG. 1 is not applied generally exhibit these values. As can be seen from FIG. 3, by applying the distortion compensation of the present invention, the ACPR is improved by about 5 dB. When the state of ACPR =−55 dBc is kept, the output power becomes 19.5 dBm, which accomplishes an increase in output by about 1.5 dB.

FIG. 4 is a graph showing comparison in circuit power consumption between the case with the distortion of the present invention and the case without the distortion of the present invention. In this figure, a curve plotted with circle dots similarly indicates the case without the distortion compensation and a curve plotted with x dots indicate the case with the distortion compensation. Although the current is increased by the operation of the FET 13, the operating current of the power amplifier 18 is reduced by the distortion compensation and thus, as a whole, it is apparent that the lower consumption of current is accomplished.

Figure 5:
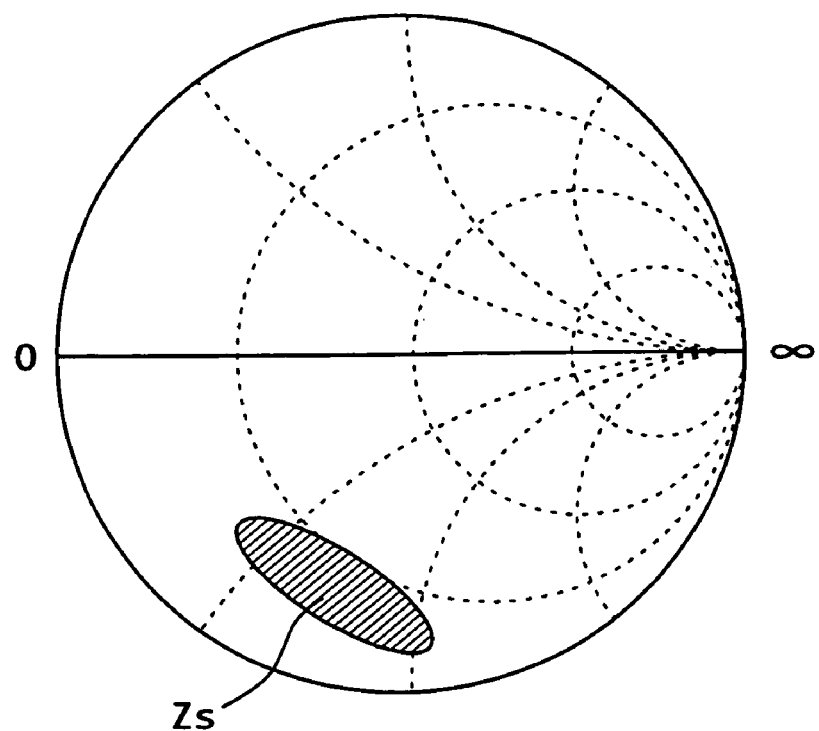
FIG. 5 is a smith chart showing a range of an impedance Zs connected to an FET gate in the embodiment of the present invention.

FIG. 5 shows an appropriate range of the impedance Zs connected to the gate of the FET 13 in the present embodiment on a smith chart. By making a design so that the impedance Zs is within the range shown in the figure, the effective distortion compensation can be performed.

Next, a second embodiment is described. As can be seen in FIG. 1, the first embodiment is the distortion compensating device which is added to the existing power amplifier from the external, while the second embodiment is such that the distortion compensating function is added inside a power amplifier to be modularized.

Figure 7:
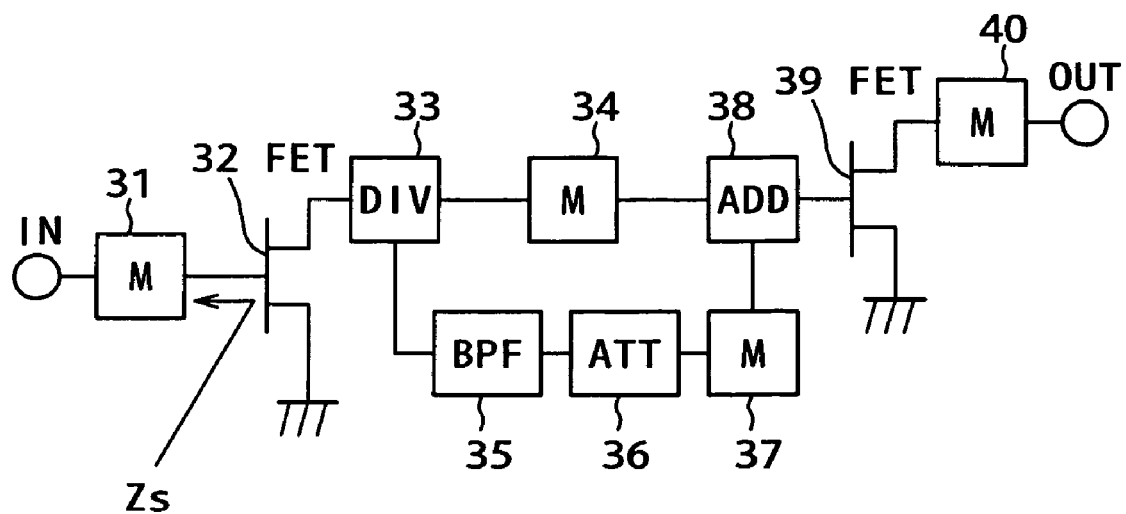
FIG. 7 is a circuit block diagram showing a configuration example of a power amplifying device according to a second embodiment of the present invention.
Figure 8:
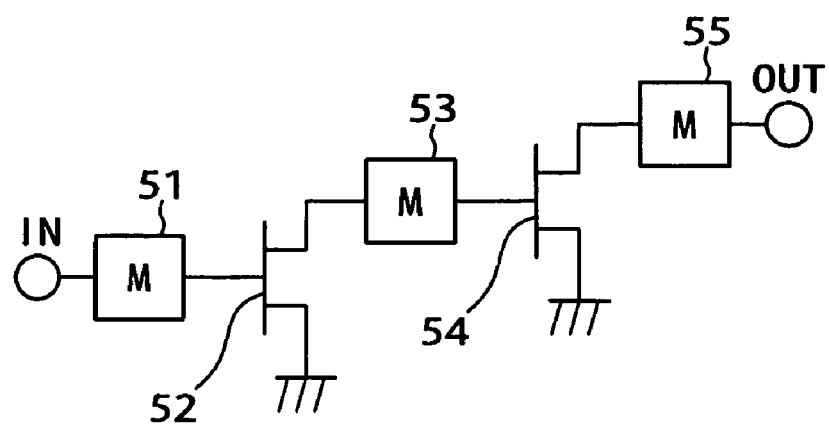
FIG. 8 is a circuit block diagram showing a configuration of a conventional typical power amplifier having no distortion compensating function.

FIG. 7 is a circuit block diagram showing a configuration example of a power amplifying device according to the second embodiment of the present invention. For reference, a configuration of a conventional typical power amplifier having no distortion compensating function is shown in FIG. 8. The power amplifier shown in FIG. 8 is a two-stage power amplifying circuit including two source grounded FETS, in which a first matching circuit 51, a first source grounded FET 52, a second matching circuit 53, a second source grounded FET 54 and a third matching circuit 55 are series-connected from an input terminal In to an output terminal OUT.

In contrast to the configuration of FIG. 8, the configuration of the second embodiment is first described, referring to FIG. 7. This power amplifying device includes an input terminal IN, a first matching circuit 31, a first source grounded FET 32, a dividing circuit 33, a band pass filter (BPF) 35, an attenuation circuit (ATT) 36, a second matching circuit 37, a third matching circuit 34, an addition circuit (add) 38, a second source grounded FET 39, a fourth matching circuit 40 and an output terminal OUT.

The matching circuit 31 is connected between a gate terminal of the source grounded FET 32 and the input terminal IN. The dividing circuit 33 is connected to a drain terminal of the FET 32 to divide the drain output into two. The band pass filter (BPF) 35 passing only a second harmonic and the attenuation circuit (ATT) 36 attenuating a signal voltage of the second harmonic are series-corrected to a first output terminal of the dividing circuit 33. The matching circuit 37 is connected between the attenuation circuit 36 and a first input terminal of the addition circuit 38. The matching circuit 34 is connected between a second output of the dividing circuit 33 and the addition circuit 38. The output of the adder 38 is connected to a gate of the second source grounded FET 39. The matching circuit 40 is connected between a drain of the FET 39 and the output terminal OUT.

Next, the operation of the power amplifying device as shown in FIG. 7 is described. The matching circuit 31, FET 32, matching circuit 34 and FET 39 compose the main two-stage power amplifier. The dividing circuit 33, band pass filter 35, attenuation circuit 36, matching circuit 37 operate in the same manner as those of the first invention. An impedance Zs on the gate side of the FET 32 which is determined by the matching circuit 31 acts similarly to the impedance Zs in the first embodiment. More specifically, the phase of the second harmonic generated in the FET 32 is adjusted to be an optimal phase by setting the appropriate impedance Zs in the matching circuit 31. This can suppress the distortion generated in the FET 39. In the present embodiment, the FET 32 plays two roles of the first stage amplification of the main power amplifier and the generation of the second harmonic for suppressing the distortion generated in the final stage FET 39 of the main amplifier. Although a distortion component generated in the FET 32 also contributes to the distortion generated in the main amplifier, its amount is so small that it can be ignored as compared with the distortion generated in the FET 39, so that if the distortion generated in the FET 39 can be suppressed, the effect is sufficient.

Although the preferred embodiments of the present invention are described above, various modifications and variations other than the foregoing can be made. For example, in the respective configurations of the above-mentioned embodiments, the FET can be replaced with a bipolar transistor. In this case, the terminals of the drain, source and gate of the FET correspond to the respective terminals of a collector, an emitter and a base of the bipolar transistor. Although a bias circuit or the like of the transistor is not shown in the figure, they can be added as necessary. Furthermore, even if the attenuation circuit and the matching circuit in the subsequent stage are deleted, an effect commensurate with the present invention can be attained.

What is claimed is:

1. A distortion compensating device which is arranged in a previous stage of a power amplifier and compensates for distortion generated in said power amplifier, comprising:
    a dividing circuit in which an input signal is divided into two and outputted to first and second output terminals;
    a matching circuit in which a signal from said first output terminal of said dividing circuit is inputted and an impedance is matched;
    a Field-Effect Transistor in which a source thereof is grounded and a signal from said matching circuit is inputted to a gate thereof;
    a band pass filter in which a signal from a drain of said Field-Effect Transistor is inputted and only a second harmonic of said input signal is passed; and
    an addition circuit in which a signal outputted from said band pass filter is added to a signal outputted from said second output terminal of said dividing circuit and said added signal is inputted to said power amplifier;
    wherein said impedance in said matching circuit affecting a phase of said second harmonic generated from said Field-Effect Transistor is matched so that a distortion component generated in said power amplifier is compensated for by said second harmonic inputted in said addition circuit.

2. The distortion compensating device according to claim 1, further comprising an attenuation circuit attenuating an output of said band pass filter at a predetermined attenuation ratio.

3. The distortion compensating device according to claim 2, further comprising a second matching circuit which is arranged between said attenuation circuit and said addition circuit, and prevents said second harmonic from being reflected at an input end of said power amplifier.

4. The distortion compensating device according to claim 1, wherein said power amplifier is used for a CDMA system mobile telephone terminal.

5. A distortion compensating device which is arranged in a previous stage of power amplifying means and compensates for distortion generated in said power amplifying means, comprising:
    dividing means in which an input signal is divided into two and outputted to first and second output sections;
    matching means in which a signal from said first output section of said dividing means is inputted and an impedance is matched;
    harmonic generating means in which said signal from said matching means is inputted and at least a second harmonic of said signal is generated;
    band pass means in which a signal from said harmonic generating means is inputted and only a second harmonic of said signal is passed; and
    addition means in which a signal outputted from said band pass means is added to a signal outputted from said second output terminal of said dividing means and said added signal is inputted to said power amplifying means;
    wherein said impedance in said matching means affecting a phase of said second harmonic generated from said harmonic generating means is matched so that a distortion component generated in said power amplifying means is compensated for by said second harmonic inputted in said addition means.

6. A distortion compensating device which is arranged in a previous stage of a power amplifier and compensates for distortion generated in said power amplifier, comprising:
    a dividing circuit in which an input signal is divided into two and outputted to first and second output terminals;
    a matching circuit in which a signal from said first output terminal of said dividing circuit is inputted and an impedance is matched;
    a Bipolar Transistor in which an emitter thereof is grounded and a signal from said matching circuit is inputted to a base thereof;
    a band pass filter in which a signal from a collector of said Bipolar Transistor is inputted and only a second harmonic of said input signal is passed; and
    an addition circuit in which a signal outputted from said band pass filter is added to a signal outputted from said second output terminal of said dividing circuit and said added signal is inputted to said power amplifier;
    wherein said impedance in said matching circuit affecting a phase of said second harmonic generated from said Bipolar Transistor is matched so that a distortion component generated in said power amplifier is compensated for by said second harmonic inputted in said addition circuit.

* * * * *